United States Patent
Noguchi et al.

(10) Patent No.: US 7,911,132 B2
(45) Date of Patent: Mar. 22, 2011

(54) ORGANIC LIGHT EMITTING DIODE HAVING ELECTRON AND HOLE MOBILITY IN LIGHT EMITTING LAYER AND DISPLAY USING THE SAME

(75) Inventors: Takafumi Noguchi, Kanagawa (JP); Masayuki Mishima, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/495,187

(22) Filed: Jun. 30, 2009

(65) Prior Publication Data

US 2009/0261324 A1 Oct. 22, 2009

Related U.S. Application Data

(62) Division of application No. 11/362,852, filed on Feb. 28, 2006, now abandoned.

(30) Foreign Application Priority Data

Feb. 28, 2005 (JP) .................................. 2005-052911

(51) Int. Cl.
*H01L 51/00* (2006.01)
(52) U.S. Cl. .................. 313/504; 313/506; 428/690
(58) Field of Classification Search .................. 313/504, 313/506; 428/690, 917
See application file for complete search history.

(56) References Cited

U.S. PATENT DOCUMENTS

| | | | |
|---|---|---|---|
| 5,343,050 A | | 8/1994 | Egusa et al. |
| 2006/0066231 A1* | | 3/2006 | Nishikawa et al. ........... 313/506 |
| 2006/0068223 A1 | | 3/2006 | Nariyuki et al. |
| 2006/0222887 A1 | | 10/2006 | Okada |

FOREIGN PATENT DOCUMENTS

| | | |
|---|---|---|
| JP | 6-36877 A | 2/1994 |
| JP | 9-082473 A | 3/1997 |
| JP | 2000-133458 A | 5/2000 |
| JP | 2000-164359 A | 6/2000 |
| JP | 2002-170667 A | 6/2002 |
| JP | 2002-313553 A | 10/2002 |
| JP | 2003-68466 A | 3/2003 |
| JP | 2003-77674 A | 3/2003 |
| JP | 2004-063209 A | 2/2004 |
| JP | 2004-241188 A | 8/2004 |
| JP | 2005-116203 A | 4/2005 |
| WO | 2004/066685 A1 | 8/2004 |
| WO | 2004/077889 A1 | 9/2004 |

* cited by examiner

Primary Examiner — Karabi Guharay
(74) Attorney, Agent, or Firm — Sughrue Mion, PLLC

(57) ABSTRACT

An organic light emitting diode comprising a pair of electrodes and a stack including a hole transport layer, a light emitting layer, and an electron transport layer, the stack being intermediate between the electrodes, the light emitting layer being of a material having hole mobility and electron mobility equal to or lower than hole mobility of the hole transport layer and electron mobility of the electron transport layer, respectively.

8 Claims, 1 Drawing Sheet

ORGANIC LIGHT EMITTING DIODE HAVING ELECTRON AND HOLE MOBILITY IN LIGHT EMITTING LAYER AND DISPLAY USING THE SAME

This is a divisional of application Ser. No. 11/362,852 filed Feb. 28, 2006. The entire disclosure of the prior application, application Ser. No. 11/362,852, is considered part of the disclosure of the accompanying divisional application and is hereby incorporated by reference. This application claims benefit under 35 U.S.C. §119 from Japanese Patent Application No. 2005-052911, filed on Feb. 28, 2005, the entire content of which is incorporated herein by reference.

FIELD OF THE INVENTION

This invention relates to an organic light emitting diode (hereinafter abbreviated as "OLED") and a display using the same. More particularly, it relates to an OLED with increased luminescence efficiency and extended life and a display using the OLED.

BACKGROUND OF THE INVENTION

OLEDs using an organic substance are promising for applications to inexpensive, large area, full-color, solid-state emissive displays or writing light source arrays and have been under active studies. OLEDs generally have a light emitting layer sandwiched between a pair of opposing electrodes. With an electric field applied to the electrodes, electrons and positive holes are injected from the cathode and the anode, respectively, into the light emitting layer, where they are recombined. Whereupon the electrons fall from the conduction band to the valence band, emitting light as an energy difference between the bands, which is observed as luminescence.

Conventional OLEDs have low luminescence efficiency and low durability, i.e., a short service life. Various techniques providing solutions to these problems have recently been proposed.

For example, JP-A-2003-68466 discloses a light emitting diode comprising a substrate having formed thereon an anode, a cathode, and a light emitting layer intermediate between the electrodes. The light emitting layer contains a host material and a dopant incorporated in the host material. Aiming to improve luminescence efficiency and life, the dopant comprises a light emitting material and a non-light-emitting material. However, the system using BCP (bathocuproine) recited in JP-A-2003-68466 is unsatisfactory in life because of the high ionization potential of BCP (6.1 eV), still leaving room for improvement.

JP-A-2003-77674 discloses a light emitting diode, the light emitting layer of which contains (1) a host material having electron transport and/or hole transport properties, (2) a first compound that produces phosphorescence at room temperature, and (3) a second compound that produces phosphorescence or fluorescence at room temperature and has a longer maximum emission wavelength than the first compound. The second compound is allowed to emit light at high efficiency. More specifically, the second compound is either a phosphorescent compound that does not emit light alone at high efficiency or a fluorescent compound that has various emission colors but with not so high emission efficiency as a phosphorescent compound at any wavelength. The disclosure teaches that the first compound showing phosphorescence at room temperature, when combined with the second compound, serves as a sensitizer to enhance the luminescence of the second compound. However, the proposed light emitting diode is insufficient in life, and an improvement is still awaited.

SUMMARY OF THE INVENTION

In order to put an OLED into practical use as a large area, full color display, it is necessary to further improve the state-of-the-art OLEDs in luminescence efficiency and durability to achieve a prolonged service life.

An object of the present invention is to provide an OLED having high luminescence efficiency and an extended life and to provide a practical display using the OLED.

To accomplish the above object, the invention provides following aspects.

(1) An organic light emitting diode comprising a pair of electrodes and a stack including a hole transport layer, a light emitting layer, and an electron transport layer, the stack being intermediate between the electrodes, wherein the organic light emitting diode satisfies the following relationships:

$$1 \leq \mu(h1)/\mu(h2) \leq 10^4$$

$$1 \leq \mu(e1)/\mu(e2) \leq 10^4$$

wherein $\mu(h1)$ is hole mobility of the hole transport layer; $\mu(e1)$ is electron mobility of the electron transport layer; $\mu(h2)$ is hole mobility of the light emitting layer; and $\mu(e2)$ is electron mobility of the light emitting layer; each of $\mu(h1)$, $\mu(e1)$, $\mu(h2)$, and $\mu(e2)$ being for an applied electric field of $10^6$ V/cm.

(2) An organic light emitting diode comprising a pair of electrodes and a stack including a hole transport layer, a light emitting layer, and an electron transport layer, the stack being intermediate between the electrodes, the light emitting layer being of a material having hole mobility and electron mobility equal to or lower than hole mobility of the hole transport layer and electron mobility of the electron transport layer, respectively, wherein the organic light emitting diode satisfies the relationship: $0.1 \leq \mu(e2)/\mu(h2) \leq 10$.

(3) An organic light emitting diode comprising a pair of electrodes and a stack including a hole transport layer, a light emitting layer, and an electron transport layer, the stack being intermediate between the electrodes, the light emitting layer being of a material having hole mobility and electron mobility equal to or lower than hole mobility of the hole transport layer and electron mobility of the electron transport layer, respectively, wherein the organic light emitting diode satisfies the relationship: $0.1 \leq \mu(e1)/\mu(h1) \leq 10$.

(4) The organic light emitting diode as described in any one of the above items (1) to (3), wherein the light emitting layer is of a material having hole mobility and electron mobility in equilibrium.

(5) The organic light emitting diode as describe in any one of the above items (1) to (4), wherein a balance of electron supply and hole supply to the light emitting layer is in equilibrium.

(6) The organic light emitting diode as described in any one of the above items (1) to (5), wherein the light emitting layer contains a hole transport material and an electron transport material.

(7) The organic light emitting diode as described in the above item (6), wherein the electron transport material is an aromatic heterocyclic compound having at least one hetero atom in the molecule thereof.

(8) The organic light emitting diode as describe in the above item (7), wherein the light emitting layer contains at least one of the same electron transport material as the electron transport layer and the same hole transport material as the hole transport layer.

(9) The organic light emitting diode as described in anyone of the above items (1) to (8), wherein the light emitting layer contains a phosphorescent material.

(10) A display having a display area comprising the organic light emitting diode as described in any one of the above items (1) to (9).

In a first aspect of the invention, an OLED comprises a pair of electrodes and a stack including a hole transport layer, a light emitting layer, and an electron transport layer, the stack being intermediate between the electrodes, wherein the OLED satisfies the following relationships:

$$1 \leq \mu(h1)/\mu(h2) \leq 10^4 \quad \text{(Formula (1))}$$

$$1 \leq \mu(e1)/\mu(e2) \leq 10^4 \quad \text{(Formula (2))};$$

preferably satisfies the following relationships:

$$1 \leq \mu(h1)/\mu(h2) \leq 10^3$$

$$1 \leq \mu(e1)/\mu(e2) \leq 10^3;$$

and more preferably satisfies the following relationships:

$$1 \leq \mu(h1)/\mu(h2) \leq 10^{2.5}$$

$$1 \leq \mu(e1)/\mu(e2) \leq 10^{2.5}$$

wherein $\mu(h1)$ is hole mobility of the hole transport layer; $\mu(e1)$ is electron mobility of the electron transport layer; $\mu(h2)$ is hole mobility of the light emitting layer; and $\mu(e2)$ is electron mobility of the light emitting layer; each of $\mu(h1)$, $\mu(e1)$, $\mu(h2)$, and $\mu(e2)$ being for an applied electric field of $10^6$ V/cm.

In a second aspect of the invention, an OLED comprises a pair of electrodes and a stack including a hole transport layer, a light emitting layer, and an electron transport layer, the stack being intermediate between the electrodes, the light emitting layer being of a material having hole mobility and electron mobility equal to or lower than hole mobility of the hole transport layer and electron mobility of the electron transport layer, respectively, wherein the OLED satisfies the relationship:

$$0.1 \leq \mu(e2)/\mu(h2) \leq 10 \quad \text{(Formula (3))},$$

preferably satisfies the relationship: $0.15 \leq \mu(e2)/\mu(h2) \leq 6$; and more preferably satisfies the relationship: $0.33 \leq \mu(e2)/\mu(h2) \leq 3$.

In a third aspect of the invention, an OLED comprises a pair of electrodes and a stack including a hole transport layer, a light emitting layer, and an electron transport layer, the stack being intermediate between the electrodes, the light emitting layer being of a material having hole mobility and electron mobility equal to or lower than hole mobility of the hole transport layer and electron mobility of the electron transport layer, respectively, wherein the OLED satisfies the relationship:

$$0.1 \leq \mu(e1)/\mu(h1) \leq 10 \quad \text{(Formula (4))};$$

preferably satisfies the relationship: $0.15 \leq \mu(e1)/\mu(h1) \leq 6$; and more preferably satisfies the relationship: $0.33 \leq \mu(e1)/\mu(h1) \leq 3$.

By these configurations, the carrier retention time in the light emitting layer is extended to increase the electron-hole recombination probability. As a result, the luminescence efficiency increases, and the electrons and holes that pass through to the opposing transport layers without participating in electron-hole recombination reduce to improve the life.

The terms "hole mobility" and "electron mobility" as used herein as to the hole transport layer, light emitting layer, and electron transport layer mean values obtained by preparing a single layer (thickness: about 2 μm) of the same material as of the corresponding layer sandwiched in between a pair of electrodes and measuring the hole or electron mobility of the single layer by a time-of-flight technique.

In the first aspect of the invention, both of the formula (1) and the formula (2) are satisfied. In the second aspect of the invention, the formula (3) is satisfied. In the second aspect, it is preferable that at least one of the formulae (1), (2) and (4) is also satisfied, and it is more preferable that all of the formulae (1), (2) and (4) are also satisfied. In the third aspect of the invention, the formula (4) is satisfied. In the third aspect, it is preferable that at least one of the formulae (1), (2) and (3) is also satisfied, and it is more preferable that all of the formulae (1), (2) and (3) are also satisfied.

In a preferred embodiment of the OLED of the invention, the light emitting layer is made of a material having the hole mobility and the electron mobility in equilibrium. By this configuration, the electron-hole recombination probability further increases to bring about increased luminescence efficiency and extended life.

In another preferred embodiment of the OLED of the invention, the balance of electron supply and hole supply to the light emitting layer is in equilibrium. By this configuration, the electron-hole recombination probability further increases to bring about further improved luminescence efficiency and extended life.

The invention also provides other preferred embodiments of the OLED, in which:

the light emitting layer contains a hole transport material and an electron transport material;

the electron transport material in the light emitting layer is an aromatic heterocyclic compound having at least one hetero atom in the molecule thereof;

the light emitting layer and the electron transport layer contain the same electron transport material;

the light emitting layer and the hole transport layer contain the same hole transport material; and/or the light emitting layer further contains a phosphorescent material.

The invention also provides still another preferred embodiment, in which the OLED satisfies the following relationships:

$$\mu(h2) \leq \mu(h1)$$

$$\mu(e2) \leq \mu(e1)$$

wherein $\mu(h1)$ is hole mobility of the hole transport layer; $\mu(e1)$ is electron mobility of the electron transport layer; $\mu(h2)$ is hole mobility of the light emitting layer; and $\mu(e2)$ is electron mobility of the light emitting layer; each of which is for an applied electric field of $10^6$ V/cm.

In yet another preferred embodiment of the invention, the OLED satisfies the relationship: $0.1 \leq \mu(e2)/\mu(h2) \leq 10$ and/or the relationship: $0.1 \leq \mu(e1)/\mu(h1) \leq 10$.

The invention also provides, in its second aspect, a display having a display area composed of the OLED according to the invention. The display with this configuration exhibits sufficient luminescence efficiency and life withstanding practical use.

The present invention provides an OLED having a high external quantum efficiency and extended service life and a display using the OLED.

DETAILED DESCRIPTION OF THE INVENTION

Figure 1:
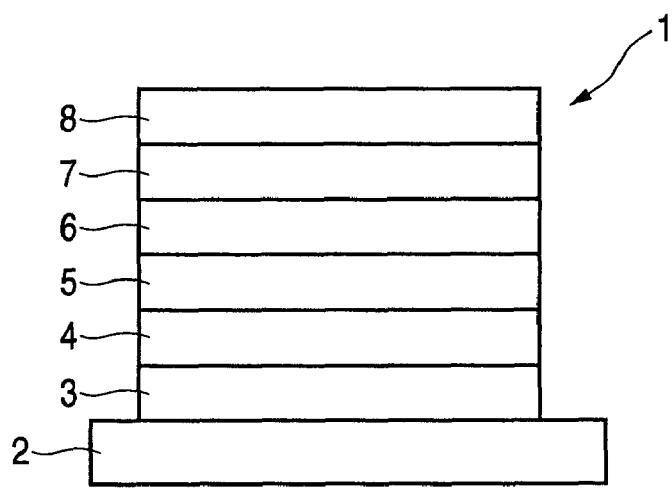
FIG. 1 illustrates a layer structure of an OLED according to an embodiment of the present invention.

The light emitting diode of the present invention has, on a substrate, a cathode, an anode, and a stack of organic compound layers between the cathode and the anode. The stack of organic compound layers includes a hole transport layer, a light emitting layer, and an electron transport layer. The stack may further have an additional organic compound layer between the electrode and the organic compound layer adjacent to the light emitting layer. In nature of a light emitting diode, at least one of the anode and the cathode is preferably transparent. The anode is transparent in an ordinary configuration.

The organic compound layers stack may have a charge blocking layer between the hole transport layer and the light emitting layer or between the light emitting layer and the electron transport layer.

The organic compound layers stack preferably has a structure of hole injection layer, hole transport layer, light emitting layer, hole blocking layer, electron transport layer, and electron injection layer in the order described from the anode side.

Where the stack has a hole blocking layer between the light emitting layer and the electron transport layer, the organic compound layers adjacent to the light emitting layer are the hole transport layer on the anode side and the hole blocking layer on the cathode side. A hole injection layer may be provided between the anode and the hole transport layer. An electron injection layer may be provided between the cathode and the electron transport layer. Each of the recited organic compound layers may be composed of two or more sublayers.

Each of the organic compound layers can be formed by any convenient processes including dry film formation techniques, such as vacuum evaporation and sputtering, a transfer process, and printing.

The light emitting layer functions to receive positive holes from the hole transport layer and electrons from the electron transport layer and allow the holes and electrons to recombine to emit light. The light emitting layer used in the invention should be made of a material whose hole mobility and electron mobility are equal to or lower than the hole mobility of the hole transport layer and the electron mobility of the electron transport layer, respectively.

The material making the light emitting layer is preferably a material having the hole and electron mobilities in equilibrium.

To satisfy the above-described conditions, the light emitting layer preferably contains a host material and a phosphorescent material as a dopant. The host material is preferably a charge transport material (the term "charge transport" is intended to mean electron transport and hole transport inclusively). Still preferably, the light emitting layer contains both a hole transport material and an electron transport material. It is preferred that at least one of the hole transport material and the electron transport material of the light emitting layer be the same as the charge transport material used in the hole transport layer or the electron transport layer.

The host material that can be used in the light emitting layer includes compounds having a pyrene skeleton, compounds having a carbazole skeleton, compounds having a diarylamine skeleton, compound having a pyridine skeleton, compounds having a pyrazine skeleton, compounds having a triazine skeleton, and compounds having an arylsilane skeleton.

It is preferred that the lowest excited multiplet energy level T1 of the host material be higher than that of the dopant material. The light emitting layer made of the host material doped with the dopant material is conveniently formed by vacuum co-deposition of the host material and the dopant material.

The phosphorescent material that can be incorporated into the light emitting layer is, in general, preferably a complex containing a transition metal atom or a lanthanoid atom. Either one or more than one phosphorescent material can be used.

Examples of the transition metal atom include, but are not limited to, ruthenium, rhodium, palladium, tungsten, rhenium, osmium, iridium, and platinum, with rhenium, iridium, and platinum being preferred. Examples of the lanthanoid atom include, but are not limited to, lanthanum, cerium, praseodymium, neodymium, samarium, europium, gadolinium, terbium, dysprosium, holmium, erbium, thulium, ytterbium, and lutetium. Preferred of the lanthanoid atoms are neodymium, europium, and gadolinium.

The ligands of the complex include those described in G. Wilkinson et al., *Comprehensive Coordination Chemistry*, Pergamon Press (1987), H. Yersin, *Photochemistry and Photophysics of Coordination Compounds*, Springer-Verlag (1987), and Yamamoto Akio, *Yuki kinzoku kagaku kiso-toohyo*, Shokabo (1982). Specific examples of suitable ligands include halogen ligands (preferably a chlorine ligand), nitrogen-containing heterocyclic ligands (e.g., phenylpyridine, benzoquinoline, quinolinol, bipyridyl, and phenanthroline), diketone ligands (e.g., acetylacetone), carboxylic acid ligands (e.g., anacetic acid ligand), a carbon monoxide ligand, an isonitrile ligand, and a cyano ligand, with nitrogen-containing heterocyclic ones being particularly preferred. The complex may be either a mononuclear one having one center metal atom or a bi- or polynuclear one having two or more center metal atoms which may be the same or different.

The phosphorescent material is preferably present in an amount of 0.1% to 20% by weight, still preferably 0.5% to 10% by weight, in the light emitting layer.

As stated, the light emitting layer may be composed of two or more sublayers which may have different luminescent colors.

If desired, the light emitting layer may contain an electrically inert binder resin in addition to the above-described components.

The thickness of the light emitting layer is not critical but is, in general, preferably 1 to 500 nm, still preferably 5 to 200 nm, even still preferably 10 to 100 nm.

The hole injection layer and the hole transport layer function to receive holes from the anode or anode side and transport them toward the cathode side. The hole injection layer and the hole transport layer preferably contain, as a hole transport material, a compound selected from carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, organosilane derivatives, and carbon.

The thickness of the hole injection layer and the hole transport layer is preferably not more than 50 nm from the viewpoint of driving voltage reduction. More specifically, the thickness of the hole transport layer is preferably 5 to 50 nm, still preferably 10 to 40 nm, and that of the hole injection layer is preferably 0.5 to 50 nm, still preferably 1 to 40 nm.

The hole transport materials may be used either individually or as a mixture of two or more thereof. The hole injection layer and the hole transport layer may be each composed of two or more sublayers which may be the same or different in composition.

The electron injection layer and the electron transport layer function to receive electrons from the cathode or the cathode side and transport them toward the anode side. The electron injection layer and the electron transport layer preferably contain, as an electron transport material, a compound selected from triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives; aromatic (e.g., naphthalene or perylene) tetracarboxylic acid anhydrides; phthalocyanine derivatives; various metal complexes, such as metal complexes of 8-quinolinol derivatives, metallo-phthalocyanines, and metal complexes having benzoxazole or benzothiazole as a ligand; or organosilanes. An electron transport layer containing an aromatic heterocyclic compound having at least one hetero atom in the molecule thereof as an electron transport material is particularly preferred. The aromatic heterocyclic compound is a hetero compound with aromaticity, including pyridine, pyrazine, pyrimidine, pyridazine, triazine, pyrazole, imidazole, benzimidazole, triazole, thiazole, benzothiazole, isothiazole, benzisothiazole, thiadiazole, and fused rings thereof.

The thickness of the electron injection layer and the electron transport layer is preferably not more than 50 nm from the viewpoint of driving voltage reduction. More specifically, the thickness of the electron transport layer is preferably 5 to 50 nm, still preferably 10 to 50 nm, and that of the electron injection layer is preferably 0.1 to 50 nm, still preferably 0.5 to 20 nm.

The electron transport materials may be used either individually or as a mixture of two or more thereof. The electron injection layer and the electron transport layer may be each composed of two or more sublayers which may be the same or different in composition.

Since the electron transport layer is adjacent to the light emitting layer, it is preferably made of a material with an ionization potential of 6.0 eV or less to secure extended life.

The hole blocking layer functions to prevent the holes transported from the anode side to the light emitting layer from escaping to the cathode side. The hole blocking layer preferably contains an aluminum complex, e.g., BAlq, a triazole derivative or a pyrazabole derivative. Where the hole blocking layer is provided as an organic compound layer adjacent to the light emitting layer, it is usually made of a material with an ionization potential of 6.0 eV or less to secure life extension.

The thickness of the hole blocking layer is preferably not more than 50 nm from the viewpoint of driving voltage reduction, still preferably 1 to 50 nm, even still preferably 5 to 40 nm.

The whole OLED may be protected with a protective layer. The protective layer can be of any material that prevents substances which may accelerate deterioration of the diode, such as moisture and oxygen, from entering the diode. Such materials include metals, e.g., In, Sn, Pb, Au, Cu, Ag, Al, Ti, and Ni; metal oxides, e.g., MgO, SiO, $SiO_2$, $Al_2O_3$, GeO, NiO, CaO, BaO, $Fe_2O_3$, $Y_2O_3$, and $TiO_2$; metal nitrides, e.g., $SiN_x$ and $SiN_xO_y$; metal fluorides, e.g., $MgF_2$, LiF, $AlF_3$, and $CaF_2$; polyethylene, polypropylene, polymethyl methacrylate, polyimide, polyurea, polytetrafluoroethylene, polychlorotrifluoroethylene, polydichlorodifluoroethylene, chlorotrifluoroethylene-dichlorodifluoroethylene copolymers, tetrafluoroethylene copolymers, fluorine-containing copolymers having a cyclic structure in the main chain thereof; water absorbing substances having a water absorption of at least 1%; and moisture-proof substances having a water absorption of 0.1% or less.

Methods for forming the protective layer include, but are not limited to, vacuum evaporation, sputtering, reactive sputtering, molecular beam epitaxy, cluster ion beam-assisted deposition, ion plating, plasma polymerization (radiofrequency-excited ion plating), plasma-enhanced CVD, laser-assisted CVD, thermal CVD, gas source CVD, wet coating techniques, printing, and transfer.

The whole OLED may be sealed in a sealing container. A desiccant or an inert liquid may be put in a space between the sealing container and the OLED. Useful desiccants include, but are not limited to, barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. Useful inert liquids include, but are not limited to, paraffins, liquid paraffins, fluorine-containing solvents (e.g., perfluoroalkanes, perfluoroamines, and perfluoroethers), chlorine-containing solvents, and silicone oils.

The OLED emits light on applying direct current electricity (which may contain an alternating component, if needed) between the anode and the cathode usually at a voltage of 2 to 15 V and a current density of 1 to 100 $mA/cm^2$. For driving the OLED, the methods taught in JP-A-2-148687, JP-A-6-301355, JP-A-5-29080, JP-A-7-134558, JP-A-8-234685, JP-A-8-241047, Japanese Patent 2784615, and U.S. Pat. Nos. 5,828,429 and 6,023,308 can be utilized.

An embodiment of the present invention will be illustrated by way of FIG. 1. FIG. 1 represents a layer structure of an OLED 1 according to the embodiment, which is used to constitute the display area of a display. The OLED 1 includes a substrate 2, an anode 3 on the substrate 2, a hole injection layer 4 on the anode 3, a hole transport layer 5 on the hole injection layer 4, a light emitting layer 6 on the hole transport layer 5, an electron transport layer 7 on the light emitting layer 6, and an electron injection layer/cathode 8 on the electron transport layer 7.

The substrate 2 that can be used in the embodiment is preferably one that does not scatter nor attenuate light emitted from the light emitting layer 6. Materials providing such substrates include inorganic materials, such as yttrium-stabilized zirconia (YSZ) and glass; and organic materials, such as polyesters (e.g., polyethylene terephthalate, polybutylene phthalate, and polyethylene naphthalate), polystyrene, polycarbonate, polyether sulfone, polyarylate, polyimide, polycycloolefins, norbornene resins, and poly(chlorotrifluoroethylene).

When a glass substrate is used, alkali-free glass is preferred for avoiding leaching of ions from glass. In using soda lime glass, one having a barrier coat of silica, etc. is preferred. The organic material as a substrate is preferably excellent in heat resistance, dimensional stability, solvent resistance, electrical insulation, and processability.

The shape, structure, and size of the substrate are not particularly limited and selected as appropriate for the intended use or purpose of the light emitting diode. In general, the substrate has a plate shape and may have either a single layer structure or a multilayer structure. It may be made of a single member or two or more members. The substrate may be either colorless transparent or colored transparent. A colorless transparent substrate is preferred for avoiding light scattering or attenuation.

A moisture proof layer (gas barrier layer) may be provided on one or both sides of the substrate. The moisture proof layer is preferably made of an inorganic substance, such as silicon nitride or silicon oxide. The moisture proof layer of such material can be formed by high frequency sputtering or like techniques. When a thermoplastic substrate is used, a hard coat or an undercoat may be provided thereon according to necessity.

The anode 3 used in the embodiment usually serves as an electrode supplying positive holes to the light emitting layer 4. The shape, structure, size, and the like are selected appropriately according to the use of the light emitting diode from among known electrode materials. As previously stated, the anode is usually formed as a transparent electrode.

Materials making up the anode include metals, alloys, metal oxides, electrically conductive compounds, and mixtures thereof. Those having a work function of 4.0 eV or higher are preferred for use as an anode. Examples of useful anode materials are conductive metal oxides, such as tin oxide doped with antimony or fluorine (ATO or FTO), tin oxide, zinc oxide, indium oxide, indium tin oxide (ITO), and indium zinc oxide (IZO); metals, such as gold, silver, chromium, and nickel; mixtures or laminates of these metals and conductive metal oxides; electrically conductive inorganic substances, such as copper iodide and copper sulfide; electrically conductive organic substances, such as polyaniline, polythiophene, and polypyrrole; and laminates of these materials and ITO. Preferred of them are electrically conductive metal oxides. ITO is particularly preferred from the viewpoint of productivity, high electrical conductivity, and transparency.

The anode 3 can be formed on the substrate 2 by an appropriate technique selected according to the material from, for example, wet film formation processes including printing and wet coating, physical processes including vacuum deposition, sputtering, and ion plating, and chemical processes including CVD and plasma-enhanced CVD. For instance, an ITO anode is formed by direct current or radio frequency sputtering, vacuum deposition or ion plating.

The position where the anode is formed is not particularly limited and determined according to the intended use and purpose of the light emitting diode. The anode is, in general, preferably formed on the substrate 2 as in the embodiment shown in FIG. 1. In this case, the anode may be provided on either a part of or the entire area of one side of the substrate 2. In the former case, patterning of the anode 3 is carried out by chemical etching by photolithography, physical etching by laser machining, vacuum deposition or sputtering through a mask, a lift-off process or printing.

While the thickness of the anode 3 is not generally specified because it should be decided as appropriate to the material, it usually ranges from about 10 nm to about 50 μm, preferably 50 nm to 20 μm.

The anode preferably has a surface resistivity of $10^3$ Ω/square or less, still preferably $10^2$ Ω/square or less. Where the anode should be a transparent electrode, it may be either colorless or colored. To attain high light extraction efficiency from the transparent anode side, it is preferred for the anode to have a transmittance of at least 60%, still preferably 70% or higher.

Details of a transparent anode are described in Sawada Yutaka (ed.), *Tomei Denkyokumaku no Shin-tenkai*, CMC (1999), which also apply to the OLED of the present embodiment. Where a plastic substrate with low heat resistance is used, an ITO or IZO transparent anode formed at or below 150° C. is recommended.

The cathode that can be used in the present embodiment usually functions to supply electrons to the electron injection layer. The shape, structure, size, etc. of the cathode are not particularly limited and selected from among known electrode materials according to the use of the light emitting diode.

Materials making up the cathode include metals, alloys, metal oxides, electrically conductive compounds, and mixtures thereof. Those having a work function of 4.5 eV or less are preferred. Examples of useful cathode materials are alkali metals (e.g., Li, Na, K, and Cs), alkaline earth metals (e.g., Mg and Ca), gold, silver, lead, aluminum, sodium-potassium alloys, lithium-aluminum alloys, magnesium-silver alloys, and rare earth metals (e.g., indium and ytterbium). While effective even when used individually, these materials are preferably used as a combination of two or more thereof to assure both stability and electron injection capabilities.

Of the recited cathode materials preferred are alkali metals and alkaline earth metals for their electron injection capabilities, and aluminum-based materials are also preferred for their storage stability. The term "aluminum-based materials" includes aluminum and an alloy or mixture of aluminum with 0.01% to 10% by weight of an alkali metal or an alkaline earth metal, e.g., a lithium-aluminum alloy or a magnesium-aluminum alloy. For the details of cathode materials reference can be made to JP-A-2-15595 and JP-A-5-121172.

The cathode can be formed by any known method selected as appropriate to the material from, for example, wet film formation by printing or coating; physical film formation including vacuum deposition, sputtering, and ion plating; and chemical film formation including CVD and plasma-enhanced CVD. For example, a metal or like cathode can be formed by sputtering a metallic material or materials. In using two or more materials, they may be sputtered either simultaneously or sequentially.

Patterning of the cathode is carried out by chemical etching by photolithography, physical etching by laser machining, vacuum deposition or sputtering through a mask, a lift-off process or a printing process.

The position of forming the cathode in the light emitting diode of the present embodiment is not particularly limited. It is formed on either the entire area or a part of the electron injection layer. A dielectric layer of, for example, a fluoride or an oxide of an alkali metal or an alkaline earth metal can be formed between the cathode and the electron injection layer to a thickness of 0.1 to 5 nm. Such a dielectric layer may be regarded as a kind of an electron injection layer. The dielectric layer can be formed by vacuum evaporation, sputtering, ion plating, etc. In FIG. 1, the cathode and the electron injection layer are depicted as a monolithic layer indicated by numeral 8.

The thickness of the cathode is decided as appropriate for the material and usually ranges from about 10 nm to about 5 μm, preferably 50 nm to 1 μm. The cathode may be either transparent or opaque. The transparent cathode can be formed by forming a film as thin as 1 to 10 nm of the above recited material and stacking thereon a transparent conductive material such as ITO or IZO.

The OLED according to the embodiment of FIG. 1 has a stack of organic compound layers including the light emitting layer 6. Organic compound layers other than the light emitting layer 6 include the hole transport layer 5, the electron transport layer 7, the hole injection layer 4, and the electron injection layer 8.

The OLED 1 of the embodiment has an ITO layer as the anode 3, a copper phthalocyanine (CuPc) layer with a thickness of about 10 nm as the hole injection layer 4, a compound A (shown below) layer with a thickness of about 50 nm as the hole transport layer 5, a co-deposited layer of compound A and Alq (shown below) at a ratio of 50:50 with a thickness of about 40 nm as the light emitting layer 6, and an Alq layer with a thickness of about 20 nm as the electron transport layer. LiF is used as an electron transport layer, and Al as a cathode material.

Compound A:

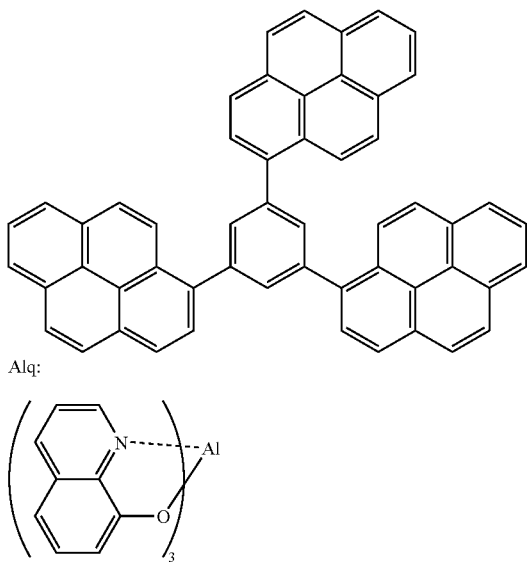

Alq:

The organic compound layers used in the OLED 1 can each be conveniently formed by any of dry film formation processes including vacuum evaporation and sputtering, transfer, printing, and the like.

Figure 2:
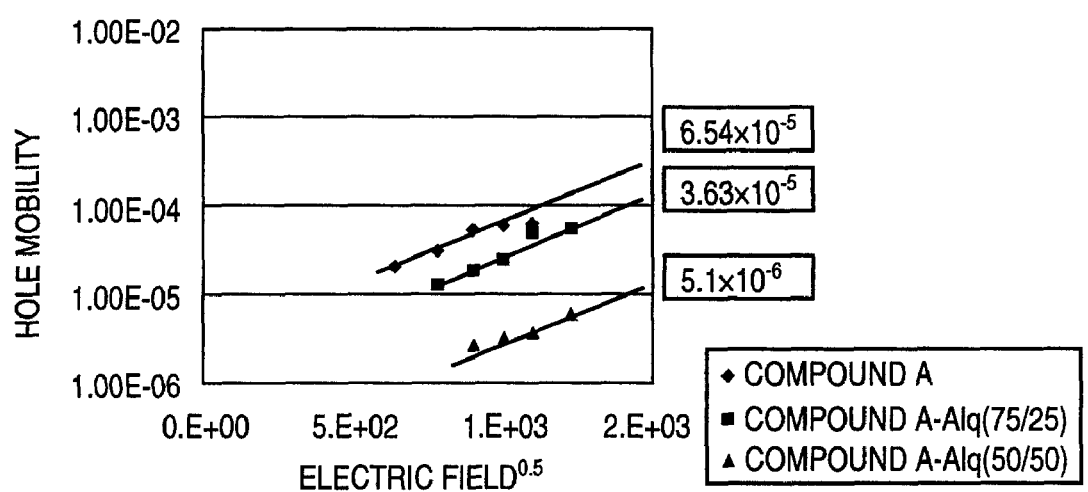
FIG. 2 illustrates hole mobility vs. electric field plots of the hole transport layer and the light emitting layer of an OLED according to an embodiment of the present invention. The values on the right hand side of the right ordinate are the hole mobilities under an applied electric field of $10^6$ V/cm. The symbol E alongside the ordinate and abscissa denotes an exponent of 10 (5.0E+02, for example, means $5.0 \times 10^2$).

As previously mentioned, the hole transport layer 5, the electron transport layer 7, and the light emitting layer 6 of the OLED 1 are a compound A layer, an Alq layer, and a 50:50 co-deposited layer of compound A and Alq, respectively. In this connection, FIG. 2 graphically represents the hole mobilities of compound A and compound A/Alq mixtures. It is seen from FIG. 2 that the compound A/Alq mixtures have lower hole mobilities than compound A and that the 50:50 mixture of compound A/Alq has lower hole mobilities than the 75:25 mixture of compound A/Alq.

Generation of light energy in an OLED is generally based on hole-electron recombination in the light emitting layer 6 between the holes injected from the hole transport layer 5 to the light emitting layer 6 and the electrons injected from the electron transport layer 7 to the light emitting layer 6. The materials making the layers 5, 6, and 7 have hitherto been selected so as to form a potential barrier between the light emitting layer 6 and the hole transport layer 5 and between the light emitting layer 6 and the electron transport layer 7 thereby to prevent the injected holes or electrons from escaping outside from the light emitting layer 6.

In contrast, the OLED 1 of the present embodiment is characterized in that the materials of the light emitting layer 6, the electron transport layer 7, and the hole transport layer 5 are designed not to positively heighten the potential barrier but such that the light emitting layer 6 may have a smaller hole mobility and electron mobility than the hole mobility of the hole transport layer 5 and the electron mobility of the electron transport layer 7, respectively. This material design aims to have the electrons and holes injected into the light emitting layer 6 remain there long to increase the recombination probability thereby to achieve increased emission efficiency.

Holes not having been recombined with electrons in the light emitting layer 6 enter the electron transport layer 7 and damage the layer 7. Likewise, electrons not having been recombined with holes in the light emitting layer 6 enter the hole transport layer 5 to damage the layer 5. Since the OLED 1 has an increased hole-electron recombination probability in the light emitting layer 6, it naturally follows that the probability of the damage to the electron transport layer 7 and the hole transport layer 5 decreases thereby to increase the service life of the light emitting diode.

More specifically, the OLED 1 of the present embodiment has the hole transport layer 5, the light emitting layer 6, and the electron transport layer 7 provided between a pair of the electrodes 3 and 8 using the respective materials that are preferably selected to satisfy the following relationships:

$$1 \leq \mu(h1)/\mu(h2) \leq 10^4$$

$$1 \leq \mu(e1)/\mu(e2) \leq 10^4$$

wherein $\mu(h1)$ is hole mobility of the hole transport layer; $\mu(e1)$ is electron mobility of the electron transport layer; $\mu(h2)$ is hole mobility of the light emitting layer; and $\mu(e2)$ is electron mobility of the light emitting layer; each of which is for an applied electric field of $10^6$ V/cm.

Or, the hole mobility $\mu(h2)$ and the electron mobility $\mu(e2)$ in the light emitting layer 6 are in equilibrium to further increase the electron-hole recombination probability in the light emitting layer 6. More specifically, a material providing a light emitting layer satisfying the relationship: $0.1 \leq \mu(e2)/\mu(h2) \leq 10$ can be used.

Or, the electron mobility $\mu(e1)$ of the electron transport layer 7, which injects electrons into the light emitting layer 6, and the hole mobility $\mu(h1)$ of the hole transport layer 5, which injects holes into the light emitting layer 6, are in equilibrium to further improve luminescence efficiency and life. More specifically, the layers 7 and 5 can be made of materials satisfying the relationship: $0.1 \leq \mu(e1)/\mu(h1) \leq 10$.

According to the above-described material design, the hole transport layer 5, the electron transport layer 7, and the light emitting layer 6 of the OLED 1 of the present embodiment are made of compound A, Alq, and a 50:50 mixture of compound A and Alq, respectively. This material design is an illustrative example, and any other materials can be used as long as the above relationships are fulfilled.

EXAMPLES

The present invention will now be illustrated in greater detail with reference to Examples, but it should be understood that the invention is not construed as being limited thereto.

Example 1

A 0.2 μm thick ITO film was formed as a transparent anode on a 0.5 mm thick, 2.5 cm-side square glass plate using a DC magnetron sputter system under the following conditions. The ITO film thus formed had a surface resistivity of 10 Ω/square.
Target: ITO target having an indium:tin molar ratio of 95:5 and an $SnO_2$ content of 10 wt %.
Substrate temperature: 250° C.
Oxygen pressure: $1\times10^{-3}$ Pa The substrate with the transparent anode was put into a washing container and washed with isopropyl alcohol and then treated with UV/ozone for 30 minutes.

Copper phthalocyanine (CuPc) was deposited on the ITO anode by vacuum evaporation at a deposition rate of 1 nm/sec to form a hole injection layer with a thickness of 0.01 μm. Compound A was deposited thereon by vacuum evaporation at a rate of 1 nm/sec to form a hole transport layer with a thickness of 0.03 μm.

Compound A and Alq were co-deposited on the hole transport layer by vacuum evaporation at a mixing weight ratio of 50:50 to form a 0.03 μm thick light emitting layer.

Alq was deposited on the light emitting layer by vacuum evaporation at a rate of 1 nm/sec to form an electron transport layer with a deposit thickness of 0.05 μm.

A patterning mask providing a luminescent area of 2 mm by 2 mm was placed on the electron transport layer, and LiF was deposited at a rate of 1 nm/sec by vacuum evaporation to form an electron injection layer having a thickness of 0.002 μm.

With the patterning mask remaining on the electron transport layer, aluminum was deposited by vacuum evaporation to a thickness of 0.25 μm to form a back electrode (cathode).

An aluminum lead wire was connected to the transparent anode and the aluminum cathode to make a luminescent structure.

The following operation was carried out in a glove box purged with nitrogen. Ten milligrams of calcium oxide powder as a desiccant was put into the recess of a stainless steel sealing cover and fixed there with adhesive tape. The luminescent structure was sealed using the thus prepared sealing cover and a UV curing adhesive (XNR5516HV from Nagase Chemtex Corp.) to complete an OLED.

The resulting OLED was evaluated as follows.
(1) A DC voltage was applied to the OLED by use of Source-Measure Unit Model 2400 supplied by Toyo Corp. to measure initial luminescent performance of the diode. The luminescence efficiency at 2000 cd/m² in terms of external quantum efficiency ($\eta_{2000}$) and voltage ($V_{2000}$) is shown in Table 1 below.
(2) Half decay time $T_{1/2}$ from the initial luminance 2000 cd/m² in constant current life testing is shown in Table 1.
(3) A structure having a single layer (thickness: about 2 μm) of the same material as each of the hole transport layer, light emitting layer, and electron transport layer sandwiched in between a pair of electrodes was prepared, and the hole mobility and/or the electron mobility of each structure in an electric field of $10^6$ V was measured by a time-of-flight technique. The results obtained are shown below.

| | |
|---|---|
| μ(h1) of hole transport layer (compound A): | $6.5 \times 10^{-5}$ cm²/V · sec |
| μ(h2) of light emitting layer: | $5.1 \times 10^{-6}$ cm²/V · sec |
| μ(e2) of light emitting layer: | $3.4 \times 10^{-6}$ cm²/V · sec |
| μ(e1) of electron transport layer (Alq): | $4.2 \times 10^{-5}$ cm²/V · sec |

It is seen that the OLED of Example 1 satisfies the relationships: $1 \leq \mu(h1)/\mu(h2) \leq 10^4$ and $1 \leq \mu(e1)/\mu(e2) \leq 10^4$. The measurements give the ratio μ(e2)/μ(h2) of 0.67 and the ratio μ(e1)/μ(h1) of 0.65, proving that the OLED also satisfies both the relationships: $0.1 \leq \mu(e2)/\mu(h2) \leq 10$ and $0.1 \leq \mu(e1)/\mu(h1) \leq 10$.

Example 2

An OLED was fabricated and evaluated in the same manner as in Example 1, except for replacing compound A making the hole transport layer with N,N'-dinaphthyl-N,N'-diphenylbenzidine (NPD) and replacing the Compound A/Alq mixture making the light emitting layer with Alq alone.

NPD:

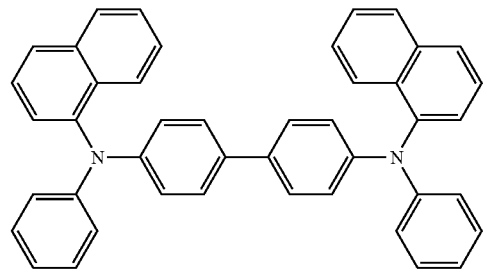

The results of evaluation on the resulting OLED are shown in Table 1. The hole mobility and electron mobility of each layer were as follows.

| | |
|---|---|
| μ(h1) of hole transport layer (NPD): | $2.7 \times 10^{-3}$ cm²/V · sec |
| μ(h2) of light emitting layer: | $3.2 \times 10^{-7}$ cm²/V · sec |
| μ(e2) of light emitting layer: | $4.2 \times 10^{-5}$ cm²/V · sec |
| μ(e1) of electron transport layer (Alq): | $4.2 \times 10^{-5}$ cm²/V · sec |

It is seen that the OLED of Example 2 satisfies the relationships: $1 \leq \mu(h1)/\mu(h2) \leq 10^4$ and $1 \leq \mu(e1)/\mu(e2) \leq 10^4$. The measurements give the ratio μ(e2)/μ(h2) of 131 and the ratio μ(e1)/μ(h1) of 0.016, proving that the OLED does not satisfy any of the relationships: $0.1 \leq \mu(e2)/\mu(h2) \leq 10$ and $0.1 \leq \mu(e1)/\mu(h1) \leq 10$.

Example 3

An OLED was fabricated and evaluated in the same manner as in Example 2, except for replacing Alq making the light emitting layer with a 50/50 mixture of Alq and NPD. The results of evaluation are shown in Table 1. The hole mobility and electron mobility of each layer were as follows.

| | |
|---|---|
| μ(h1) of hole transport layer (NPD): | $2.7 \times 10^{-3}$ cm²/V · sec |
| μ(h2) of light emitting layer: | $7.1 \times 10^{-4}$ cm²/V · sec |
| μ(e2) of light emitting layer: | $2.1 \times 10^{-6}$ cm²/V · sec |
| μ(e1) of electron transport layer (Alq): | $4.2 \times 10^{-5}$ cm²/V · sec |

The OLED of Example 3 satisfies the relationships: $1 \leq \mu(h1)/\mu(h2) \leq 10^4$ and $1 \leq \mu(e1)/\mu(e2) \leq 10^4$. The measurements give the ratio μ(e2)/μ(h2) of 0.003 and the ratio μ(e1)/μ(h1) of 0.016, revealing that the OLED does not satisfy any of the relationships: $0.1 \leq \mu(e2)/\mu(h2) \leq 10$ and $0.1 \leq \mu(e1)/\mu(h1) \leq 10$.

TABLE 1

|  | $\mu_{2000}$ (%) | $V_{2000}$ (V) | $T_{1/2}$ (hr) |
|---|---|---|---|
| Example 1 | 2.0 | 9.5 | 800 |
| Example 2 | 1.1 | 9.0 | 350 |
| Example 3 | 0.9 | 9.0 | 450 |

Example 4

A 0.2 μm thick ITO film was formed as a transparent anode on a 0.5 mm thick, 2.5 cm-side square glass plate using a DC magnetron sputter system under the following conditions. The ITO film thus formed had a surface resistivity of 10 Ω/square.

Target: ITO target having an indium:tin molar ratio of 95:5 and an $SnO_2$ content of 10 wt %.

Substrate temperature: 250° C.

Oxygen pressure: $1 \times 10^{-3}$ Pa

The substrate with the transparent anode was put into a washing container and washed with isopropyl alcohol and then treated with UV/ozone for 30 minutes.

Copper phthalocyanine was deposited on the ITO anode by vacuum evaporation at a deposition rate of 1 nm/sec to form a hole injection layer with a thickness of 0.01 μm. NPD was deposited thereon by vacuum evaporation at a rate of 1 nm/sec to form a hole transport layer with a thickness of 0.03 μm.

Firpic (shown below) as a phosphorescent compound, mCP (shown below) as a hole transport material, and compound B (shown below) as an electron transport material were co-deposited on the hole transport layer by vacuum evaporation at a mixing ratio of 5/75/25 to form a 0.03 μm thick light emitting layer.

Firpic:

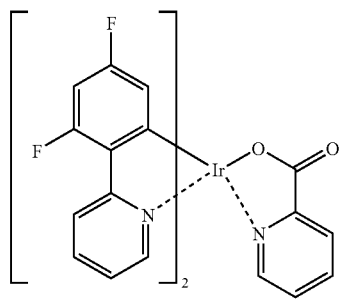

mCP:

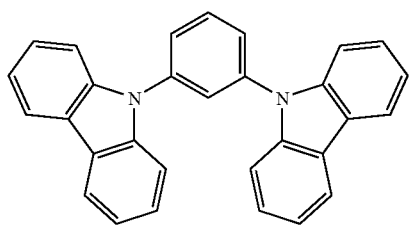

Compound B:

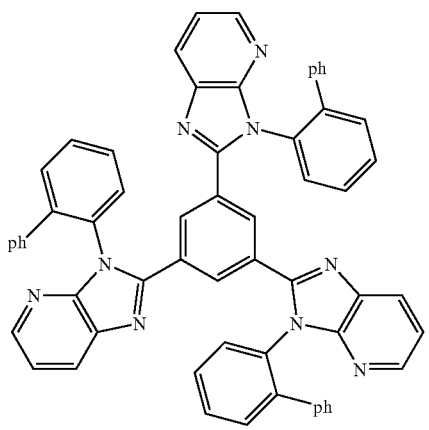

Balq2 (shown below) was deposited on the light emitting layer at a rate of 1 nm/sec to form a blocking layer with a thickness of 0.01 μm.

Balq 2:

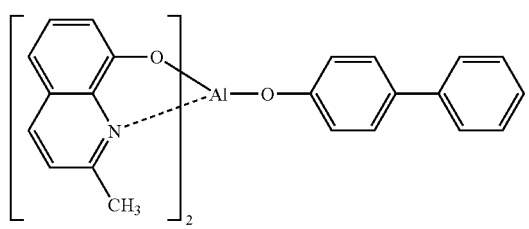

Alq was deposited on the blocking layer by vacuum evaporation at a rate of 0.2 nm/sec to form an electron transport layer with a thickness of 0.04 μm.

A patterning mask providing a luminescent area of 2 mm by 2 mm was placed on the electron transport layer, and LiF was deposited at a rate of 1 nm/sec by vacuum evaporation to form an electron injection layer having a thickness of 0.002 μm.

With the patterning mask remaining on the electron transport layer, aluminum was deposited by vacuum evaporation to a thickness of 0.25 μm to form a back electrode (cathode).

An aluminum lead wire was connected to the transparent anode and the aluminum cathode to fabricate a luminescent structure.

The following operation was carried out in a glove box purged with nitrogen. Ten milligrams of calcium oxide powder as a desiccant was put into the recess of a stainless steel sealing cover and fixed there with adhesive tape. The luminescent structure was sealed using the thus prepared sealing cover and a UV curing adhesive (XNR5516HV from Nagase Chemtex Corp.) to complete an OLED.

The resulting OLED was evaluated as follows.

(1) A DC voltage was applied to the OLED by use of Source-Measure Unit Model 2400 supplied by Toyo Corp. to evaluate initial luminescent performance of the diode. The luminescence efficiency at 360 cd/m² in terms of external quantum efficiency ($\eta_{360}$) and voltage ($V_{360}$) is shown in Table 2 below.

(2) Half decay time $T_{1/2}$ from the initial luminance 360 cd/m² in constant current life testing is shown in Table 2.

(3) The hole mobility and/or electron mobility of the hole transport layer, light emitting layer, and electron transport layer were measured in the same manner as in Example 1 to give the following results.

| | |
|---|---|
| μ(h1) of hole transport layer (NPD): | $2.7 \times 10^{-3}$ cm$^2$/V·sec |
| μ(h2) of light emitting layer: | $7.3 \times 10^{-5}$ cm$^2$/V·sec |
| μ(e2) of light emitting layer: | $6.1 \times 10^{-5}$ cm$^2$/V·sec |
| μ(e1) of electron transport layer (Alq): | $4.2 \times 10^{-5}$ cm$^2$/V·sec |

The OLED of Example 4 satisfies the relationship: $\mu(h2) \leq \mu(h1)$. The measurements give the ratio $\mu(e2)/\mu(h2)$ of 0.84, proving that the OLED also satisfies the relationship: $0.1 \leq \mu(e2)/\mu(h2) \leq 10$. Thus, the formula (3) is satisfied and long life is had.

Example 5

An OLED was fabricated and evaluated in the same manner as in Example 4, except for replacing Alq as an electron transport material with compound B. The results of evaluation are shown in Table 2. The hole mobility and electron mobility of each layer as measured in the same manner as in Example 1 were as follows.

| | |
|---|---|
| μ(h1) of hole transport layer (NPD): | $2.7 \times 10^{-3}$ cm$^2$/V·sec |
| μ(h2) of light emitting layer: | $7.3 \times 10^{-5}$ cm$^2$/V·sec |
| μ(e2) of light emitting layer: | $6.1 \times 10^{-5}$ cm$^2$/V·sec |
| μ(e1) of electron transport layer (compound B): | $2.5 \times 10^{-3}$ cm$^2$/V·sec |

The OLED of Example 5 satisfies the relationships: $1 \leq \mu(h1)/\mu(h2) \leq 10^4$ and $1 \leq \mu(e1)/\mu(e2) \leq 10^4$. The measurements give the ratio $\mu(e2)/\mu(h2)$ of 0.84 and the ratio $\mu(e1)/\mu(h1)$ of 0.93, proving that the OLED also satisfies both the relationships: $0.1 \leq \mu(e2)/\mu(h2) \leq 10$ and $0.1 \leq \mu(e1)/\mu(h1) \leq 10$. Thus, the formulae (1) to (4) are satisfied, and high luminescence efficiency and long life are both had.

Example 6

An OLED was fabricated and evaluated in the same manner as in Example 4, except for replacing the co-deposited Firpic/mCP/compound (B) as a light emitting layer with a co-deposited layer of Firpic and mCP (deposition ratio is 5:100). The results of evaluation are shown in Table 2. The hole mobility and electron mobility of each layer as measured in the same manner as in Example 1 were as follows.

| | |
|---|---|
| μ(h1) of hole transport layer (NPD): | $2.7 \times 10^{-3}$ cm$^2$/V·sec |
| μ(h2) of light emitting layer: | $9.5 \times 10^{-5}$ cm$^2$/V·sec |
| μ(e2) of light emitting layer: | $2.8 \times 10^{-6}$ cm$^2$/V·sec |
| μ(e1) of electron transport layer (Alq): | $4.2 \times 10^{-5}$ cm$^2$/V·sec |

The OLED of Example 6 satisfies the relationships: $1 \leq \mu(h1)/\mu(h2) \leq 10^4$ and $1 \leq \mu(e1)/\mu(e2) \leq 10^4$. The measurements give the ratio $\mu(e2)/\mu(h2)$ of 0.029 and the ratio $\mu(e1)/\mu(h1)$ of 0.016, indicating that the OLED does not satisfy either of the relationships: $0.1 \leq \mu(e2)/\mu(h2) \leq 10$ and $0.1 \leq \mu(e1)/\mu(h1) \leq 10$.

TABLE 2

| | $\mu_{360}$ (%) | $V_{360}$ (V) | $T_{1/2}$ (hr) |
|---|---|---|---|
| Example 4 | 5.8 | 10.0 | 120 |
| Example 5 | 8.1 | 10.0 | 120 |
| Example 6 | 4.2 | 9.0 | 70 |

Example 7

An OLED was fabricated in the same manner as in Example 4, except for replacing the co-deposited Firpic/mCP/compound (B) as a light emitting layer with a co-deposited layer of Ir(ppy)3 (shown below) as a phosphorescent compound, CBP (shown below) as a hole transport material, and compound C (shown below) as an electron transport material at a ratio of 5:60:40. The resulting OLED was evaluated in the same manner as in Example 1. The results of evaluation are shown in Table 3 below. The hole mobility and electron mobility of each layer as measured in the same manner as in Example 1 were as follows.

| | |
|---|---|
| μ(h1) of hole transport layer (NPD): | $2.7 \times 10^{-3}$ cm$^2$/V·sec |
| μ(h2) of light emitting layer: | $1.2 \times 10^{-5}$ cm$^2$/V·sec |
| μ(e2) of light emitting layer: | $3.1 \times 10^{-5}$ cm$^2$/V·sec |
| μ(e1) of electron transport layer (Alq): | $4.2 \times 10^{-5}$ cm$^2$/V·sec |

The OLED of Example 7 satisfies the relationships: $1 \leq \mu(h1)/\mu(h2) \leq 10^4$ and $1 \leq \mu(e1)/\mu(e2) \leq 10^4$. The measurements give the ratio $\mu(e2)/\mu(h2)$ of 2.6, indicating that the OLED satisfies the relationship: $0.1 \leq \mu(e2)/\mu(h2) \leq 10$.

Ir (ppy) 3:

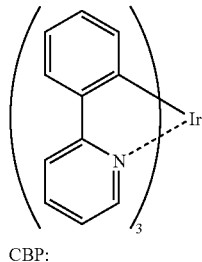

CBP:

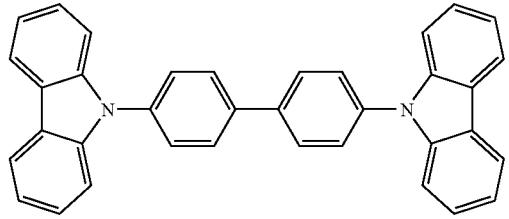

Compound C:

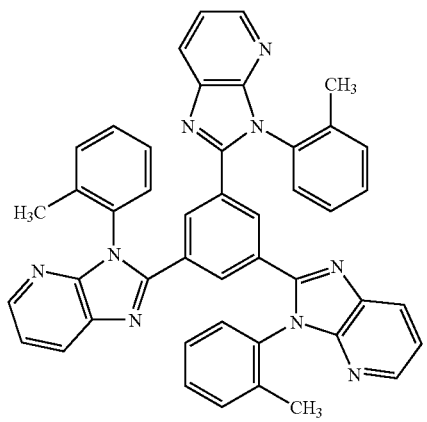

Example 8

An OLED was fabricated in the same manner as in Example 4, except for replacing Alq as an electron transport material with compound C. The results of evaluation are shown in Table 3. The hole mobility and electron mobility of each layer as measured in the same manner as in Example 1 were as follows.

| | |
|---|---|
| μ(h1) of hole transport layer (NPD): | $2.7 \times 10^{-3}$ cm²/V · sec |
| μ(h2) of light emitting layer: | $7.3 \times 10^{-5}$ cm²/V · sec |
| μ(e2) of light emitting layer: | $6.1 \times 10^{-5}$ cm²/V · sec |
| μ(e1) of electron transport layer (compound C): | $9.0 \times 10^{-4}$ cm²/V · sec |

The OLED of Example 8 satisfies the relationships: $1 \leq \mu(h1)/\mu(h2) \leq 10^4$ and $1 \leq \mu(e1)/\mu(e2) \leq 10^4$. The measurements give the ratio $\mu(e2)/\mu(h2)$ of 0.84 and the ratio $\mu(e1)/\mu(h1)$ of 0.33, proving that the OLED also satisfies both the relationships: $0.1 \leq \mu(e2)/\mu(h2) \leq 10$ and $0.1 \leq \mu(e1)/\mu(h1) \leq 10$.

Example 9

An OLED was fabricated and evaluated in the same manner as in Example 8, except for replacing NPD as a hole transport material with compound A. The results of evaluation are shown in Table 3. The hole mobility and electron mobility of each layer as measured in the same manner as in Example 1 were as follows.

| | |
|---|---|
| μ(h1) of hole transport layer (compound A): | $6.5 \times 10^{-5}$ cm²/V · sec |
| μ(h2) of light emitting layer: | $7.3 \times 1^{-5}$ cm²/V · sec |
| μ(e2) of light emitting layer: | $6.1 \times 10^{-5}$ cm²/V · sec |
| μ(e1) of electron transport layer (compound C): | $9.0 \times 10^{-4}$ cm²/V · sec |

The OLED of Example 9 satisfies the relationship: $1 \leq \mu(e1)/\mu(e2) \leq 10^4$. The measurements give the ratio $\mu(e2)/\mu(h2)$ of 0.84 and the ratio $\mu(e1)/\mu(h1)$ of 13.85, indicating that the OLED also satisfies the relationship: $0.1 \leq \mu(e2)/\mu(h2) \leq 10$ but does not satisfy the relationship: $0.1 \leq \mu(e1)/\mu(h1) \leq 10$. The diode does not satisfy the relationship: $\mu(h2) \leq \mu(h1)$, either.

Example 10

An OLED was fabricated and evaluated in the same manner as in Example 8, except for replacing the co-deposited Ir(ppy)3/CBP/compound C layer as a light emitting layer with a co-deposited layer of Ir(ppy)3/CBP (deposition ratio is 5:100). The results of evaluation are shown in Table 3. The hole mobility and electron mobility of each layer as measured in the same manner as in Example 1 were as follows.

| | |
|---|---|
| μ(h1) of hole transport layer (NPD): | $2.7 \times 10^{-3}$ cm²/V · sec |
| μ(h2) of light emitting layer: | $9.8 \times 1^{-4}$ cm²/V · sec |
| μ(e2) of light emitting layer: | $1.3 \times 10^{-7}$ cm²/V · sec |
| μ(e1) of electron transport layer (compound C): | $9.0 \times 10^{-4}$ cm²/V · sec |

The OLED of Example 10 satisfies the relationships: $\mu(h2) \leq \mu(h1)$ and $\mu(e2) \leq \mu(e1)$. The measurements give the ratio $\mu(e2)/\mu(h2)$ of 0.00013 and the ratio $\mu(e1)/\mu(h1)$ of 0.33. That is, the relationship: $0.1 \leq \mu(e2)/\mu(h2) \leq 10$ is not satisfied.

Example 11

An OLED was fabricated and evaluated in the same manner as in Example 7, except for replacing the co-deposited Ir(ppY)3/CBP/compound C layer as a light emitting layer with a co-deposited layer of Ir(ppy)3/CBP (deposition ratio is 5:100). The results of evaluation are shown in Table 3. The hole mobility and electron mobility of each layer as measured in the same manner as in Example 1 were as follows.

| | |
|---|---|
| μ(h1) of hole transport layer (NPD): | $2.7 \times 10^{-3}$ cm²/V · sec |
| μ(h2) of light emitting layer: | $9.8 \times 10^{-4}$ cm²/V · sec |
| μ(e2) of light emitting layer: | $1.3 \times 10^{-7}$ cm²/V · sec |
| μ(e1) of electron transport layer (Alq): | $4.2 \times 10^{-5}$ cm²/V · sec |

The OLED of Example 11 satisfies the relationships: $1 \leq \mu(h1)/\mu(h2) \leq 10^4$ and $1 \leq \mu(e1)/\mu(e2) \leq 10^4$. The measurements give the ratio $\mu(e2)/\mu(h2)$ of 0.00013 and the ratio $\mu(e1)/\mu(h1)$ of 0.016. That is, the OLED does not satisfy either of the relationships: $0.1 \leq \mu(e2)/\mu(h2) \leq 10$ and $0.1 \leq \mu(e1)/\mu(h1) \leq 10$.

TABLE 3

| | $\mu_{2000}$ (%) | $V_{2000}$ (V) | $T_{1/2}$ (hr) |
|---|---|---|---|
| Example 7 | 8.0 | 9.0 | 1200 |
| Example 8 | 9.1 | 8.5 | 1300 |
| Example 9 | 5.2 | 9.0 | 650 |
| Example 10 | 6.5 | 8.5 | 750 |
| Example 11 | 6.3 | 9.0 | 700 |

The OLED according to the present invention has high luminescence efficiency and long life. It is therefore suitable for practical use and provides a practical, large-area, full-color display.

This application is based on Japanese Patent application JP 2005-52911, filed Feb. 28, 2005, the entire content of which is hereby incorporated by reference, the same as if set forth at length.

What is claimed is:

1. An organic light emitting diode comprising a pair of electrodes and a stack including a hole transport layer, a light emitting layer, and an electron transport layer, the stack being intermediate between the electrodes, the light emitting layer being of a material having hole mobility and electron mobility equal to or lower than hole mobility of the hole transport layer and electron mobility of the electron transport layer, respectively,
wherein the organic light emitting diode satisfies the relationship: $0.1 \leq \mu(e2)/\mu(h2) \leq 10$, wherein $\mu(e2)$ is electron mobility of the light emitting layer and $\mu(h2)$ is hole mobility of the light emitting layer.

2. The organic light emitting diode as claimed in claim 1, wherein the light emitting layer is of a material having hole mobility and electron mobility in equilibrium.

3. The organic light emitting diode as claimed in claim 1, wherein a balance of electron supply and hole supply to the light emitting layer is in equilibrium.

4. The organic light emitting diode as claimed in claim 1, wherein the light emitting layer contains a hole transport material and an electron transport material.

5. The organic light emitting diode as claimed in claim 4, wherein the electron transport material is an aromatic heterocyclic compound having at least one hetero atom in the molecule thereof.

6. The organic light emitting diode as claimed in claim 5, wherein the light emitting layer contains at least one of the same electron transport material as the electron transport layer and the same hole transport material as the hole transport layer.

7. The organic light emitting diode as claimed in claim 1, wherein the light emitting layer contains a phosphorescent material.

8. A display having a display area comprising the organic light emitting diode as claimed in claim 1.

\* \* \* \* \*